United States Patent [19]

Hertel et al.

[11] Patent Number: 4,602,713
[45] Date of Patent: Jul. 29, 1986

[54] MULTIPLE WAFER HOLDER FOR A WAFER TRANSFER SYSTEM

[75] Inventors: Richard J. Hertel, Bradford; Leo V. Klos, Newburyport, both of Mass.

[73] Assignee: Varian Associates, Inc., Palo Alto, Calif.

[21] Appl. No.: 534,949

[22] Filed: Sep. 22, 1983

[51] Int. Cl.⁴ ............................................. B65D 85/48
[52] U.S. Cl. ..................................... 206/329; 206/454
[58] Field of Search .................. 206/454, 329, 328, 8, 206/84; 211/40

[56] References Cited

U.S. PATENT DOCUMENTS

| 3,850,296 | 11/1974 | Hirata et al. | 206/454 |
| 4,311,427 | 1/1982 | Coad et al. | 414/217 |
| 4,450,960 | 5/1984 | Johnson | 206/454 |
| 4,471,716 | 9/1984 | Milliren | 206/454 |
| 4,490,087 | 12/1984 | Ryan et al. | 206/454 |
| 4,493,418 | 1/1985 | Johnson | 206/454 |

FOREIGN PATENT DOCUMENTS 57-27149 2/1982 Japan .

OTHER PUBLICATIONS

*Instruction Manual Production Ion Implanter Model 200-20A1*, Varian Extrion Division, Apr. 1976, Section 1.4.8(a).

*Primary Examiner*—Joseph Man-Fu Moy
*Attorney, Agent, or Firm*—Stanley Z. Cole; William R. McClellan

[57] ABSTRACT

A multiple wafer holder generally of the size and shape of a standard wafer has on its front surface a plurality of pockets. The edge of each pocket is generally V-shaped and grooved so that wafers of different sizes can be carried by each holder and more than one wafer can be transported together into the processing chamber of an implanter from a cassette.

5 Claims, 3 Drawing Figures

MULTIPLE WAFER HOLDER FOR A WAFER TRANSFER SYSTEM

BACKGROUND OF THE INVENTION

This invention relates generally to apparatus for automated transfer of semiconductor wafers between processing stations and more particularly to a means for holding a plurality of wafers in vertical positions not only during such transfers but also during processing.

Attempts have been made to automate the handling and transfer of thin substrates during ion implantation, sputter coating and other processes both for preventing contamination, abrasion or damage to the substrates and for achieving a high throughput in terms of the number of substrates processed per unit time. In the transfer systems disclosed in U.S. Pat. No. 4,311,427 issued Jan. 19, 1982 to Coad et al and in U.S. patent application Ser. No. 381,085 filed May 24, 1982 by Hertel et al, for example, wafer carriers, or cassettes, are provided to hold a plurality of wafers in vertically facing alignment and to move horizontally past a loading station of a processing chamber. The cassette is essentially a rectangular frame having a pair of parallel side walls which stand facing each other and are grooved so that standard-sized disk-shaped wafers can be held edgewise. A vertically movable blade can pass through the cassette to engage a wafer from below and to move it upward into the processing chamber. The grooves on the side walls of the cassette are vertical and parallel to each other so that the wafer can slide along these grooves into and out of the cassette while maintaining its upright position.

The wafer transfer system described above is disadvantageous in that each cassette is designed for wafers of a fixed, or standard size. Cassettes for wafers of different sizes such as diameters of 100 mm, 125 mm and 150 mm are currently available commercially. It seems, however, that cassettes for holding wafers of diameters in the range of about 10 mm to 40 mm are not readily available. This means either that such wafers cannot be automatically processed in prior art systems or that cassettes specially designed for such sizes must be provided. It is preferable, however, to be able to process wafers of different diameters without the necessity of replacing the cassette. When wafers which are much smaller than the standard size are processed, furthermore, it is desirable to be able to process more than one wafer at a time in order to attain high throughput.

It is therefore an object of the present invention to provide a wafer transfer system adaptable to wafers of various sizes.

It is another object of the present invention to provide a multiple wafer holder which can be used with a cassette for wafers of the standard size.

SUMMARY OF THE INVENTION

According to the present invention, the above and other objects are achieved by forming a plurality of V-shaped pockets on the surface of a holder having the size and shape of a standard disk-like wafer so that so many smaller-than-standard sized wafers can be carried by each holder as there are pockets. Each pocket holds the wafer edgewise by a retaining wedge action so that the wafers carried by such holder can be taken out of the cassette and processed together.

DETAILED DESCRIPTION OF THE INVENTION

Figure 1:
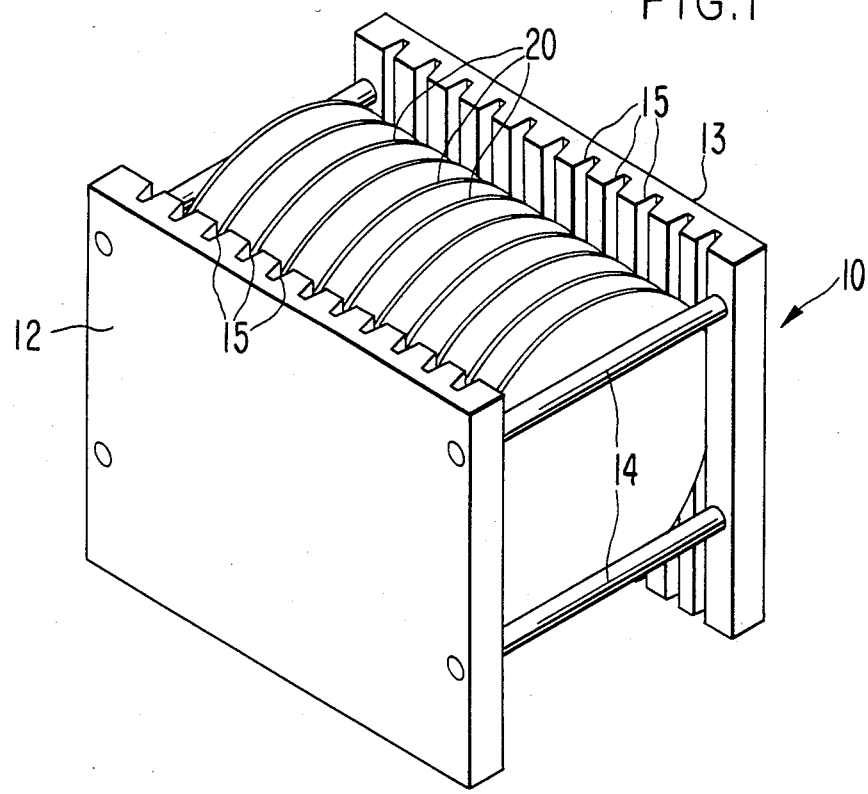
FIG. 1 shows schematically a diagonal view of the multiple wafer holders of the present invention loaded in a cassette of a typical design.

Referring first to FIG. 1, there is sketched a diagonal view of a cassette 10 together with a plurality of multiple wafer holders 20 embodying the present invention. The cassette 10 is basically a rectangular frame, having a pair of side walls 12 and 13 and any number of support elements 14 for maintaining a fixed interval between the side walls 12 and 13. On the inside surfaces of the side walls 12 and 13 facing each other, there are provided a plurality of parallel grooves 15 which run vertically so that the holder 20 can move vertically upward and downward with side edges slidably moving inside these grooves 15.

The holder 20 is an aluminum disk of thickness about 1 mm and diameter about 100 mm (standard wafer size) so that the cassette 10 can be one for carrying wafers of standard size, for example, in the wafer transfer system of U.S. patent application Ser. No. 381,085 mentioned above.

Figure 2:
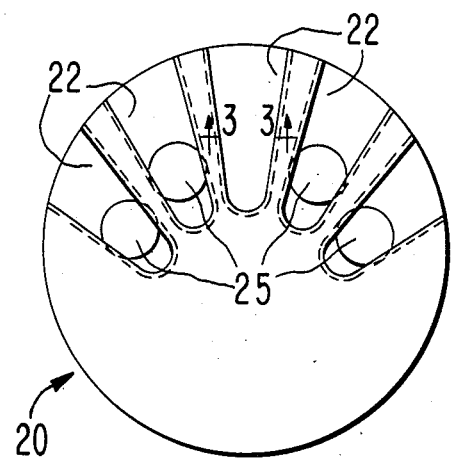
FIG. 2 is a front view of the multiple wafer holder of the present invention according to an embodiment designed for carrying five wafers.

Referring next to FIG. 2, there is shown the front surface of the holder 20 according to one embodiment. By the front surface is intended to mean the surface which will be facing the beam of impinging charged particles when the holder is positioned, for example, inside the processing chamber of an ion implantation device (not shown).

The front surface of the holder 20 is characterized by the existence of a number of V-shaped open pockets 22, each opening both in front so as to expose the front surface of any inserted wafer substantially entirely by holding it only edgewise and in an upward direction so that wafers 25 much smaller than the standard size (i.e., the size of the holder 20) can be inserted into them and held against the holder 20. The number of pockets 22 on each holder 20 and the exact shape of the pockets 22 depend primarily on the range of the size of the wafers to be inserted. If the diameter of the wafers to be inserted is not much smaller than one-half that of the holder 20, only one pocket can be provided while FIG. 2 shows an example with five pockets per holder, the diameter of the wafers to be processed being less than one-seventh that of the holder 20.

Figure 3:
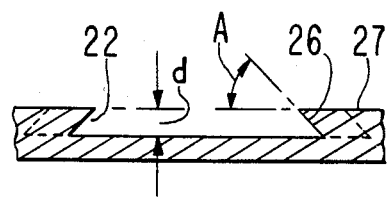
FIG. 3 is a cross sectional view along line 3—3 of FIG. 2.

FIG. 3 is a cross sectional view along line 3—3 of FIG. 2 and shows how a blank aluminum disk should be machine-cut, or processed otherwise, to provide pockets on the holder 20. The side walls 26 of the pocket 22 makes an acute angle A with the front surface 27 of the holder 20 so that a dovetail form will result and a wafer with thickness less than the depths of the pocket (shown by d in FIG. 3) can be slidably inserted into and securely held inside the pocket 22 much in the same way as the holders 20 can be inserted into a cassette 10 by sliding them along the grooves 15, exposing its front surface substantially entirely. Angle A may be typically in the range of 30 to 45 degrees.

In operation, a plurality (up to the number of pockets on each holder) of smaller-than-standard sized wafers are inserted in the pockets of a holder and the holders thus fully loaded are in turn slidably deposited in a cassette generally of the form shown in FIG. 1. When the wafers are to be processed by an implanter such as Extrion Model 350D, the cassette is loaded into an automated wafer transfer system. The first holder with its group of wafers to be processed is lifted from the cassette into the implant position. In other words, these wafers remain inserted in their respective pockets throughout the transfer and implant processes and it is actually the holder carrying these wafers in its pockets that is lifted out of the cassette and into the path of impinging ions. After the implant is terminated when the predetermined total dose has been received by each of the wafers, the holder is lowered back into its original position inside the cassette, the processed wafers remaining inserted inside there respective pockets, and the holder carrying the next group of wafers to be processed is cycled in. This continues until all the wafers have been implanted; this, of course, need not be the full capacity but may be any preset quantity less than the maximum number.

This invention has been described above in terms of only one particular embodiment. The above description, however, is to be considered as illustrative rather than as limiting, and this invention is accordingly to be broadly construed. For example, the holder 20 need not be of aluminum. Nor need it be a circular disk. If it is a circular disk, its diameter can be varied according to the convenience and circumstances such as the design of the cassette. A portion or portions of the disk surface may be machined through or relieved to a certain depth so that the back of the loaded wafer will not contact the disk surface. The number of pockets 22 on each holder 20 can be changed optionally, depending on the size of the wafers to be carried. The pockets need not be exactly V-shaped, nor need they be arranged in fan-shaped array as shown in FIG. 2. The cross sectional shape of the pocket may be other than dovetail as long as a retaining wedge action can be provided on the wafer to be inserted. A variety of designs is also allowed to the cassette, for example, in terms of the number and the shape of the grooves as well as the interval between them. In operation, furthermore, the holder may be loaded with wafers of different sizes and more than one wafer of different sizes may be inserted in any pocket, depending on its size and shape. The holder of this invention can even accept broken wafers. The scope of the invention is defined only by the following claims.

What is claimed is:

1. A multiple wafer holder comprising a generally planar disk having a front surface provided with a plurality of pockets for holding wafers in substantially coplanar orientation with a surface of each wafer exposed, a rear surface opposite said front surface and a periphery joining said front and rear surfaces, said pockets each being open at the holder periphery for insertion and removal of wafers and having grooved edges which taper inwardly from the holder periphery toward each other so that wafers of different sizes can be held edgewise therein.

2. The wafer holder of claim 1 wherein said pockets are substantially V-shaped.

3. The wafer holder of claim 2 wherein said plurality of pockets forms a generally fan-shaped array on the holder.

4. The wafer holder of claim 1 wherein the diameter and thickness of the disk are selected such that the holder can be inserted into a wafer-holding cassette.

5. The wafer holder of claim 1 wherein said grooved edges are angled inwardly toward the front surface of said disk.

* * * * *